(12) United States Patent
Kim et al.

(10) Patent No.: US 10,586,699 B2
(45) Date of Patent: Mar. 10, 2020

(54) METHOD OF ASSESSING SEMICONDUCTOR SUBSTRATE AND METHOD OF ASSESSING DEVICE CHIP

(71) Applicant: DISCO CORPORATION, Tokyo (JP)

(72) Inventors: Youngsuk Kim, Tokyo (JP); Shoichi Kodama, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/129,274

(22) Filed: Sep. 12, 2018

(65) Prior Publication Data

US 2019/0080905 A1 Mar. 14, 2019

(30) Foreign Application Priority Data

Sep. 13, 2017 (JP) ................... 2017-176095

(51) Int. Cl.
| | |
|---|---|
| *H01L 21/31* | (2006.01) |
| *H01L 21/469* | (2006.01) |
| *H01L 21/02* | (2006.01) |
| *H01L 21/268* | (2006.01) |
| *H01L 21/66* | (2006.01) |
| *G01R 31/28* | (2006.01) |
| *G01R 31/26* | (2020.01) |
| *G01R 31/311* | (2006.01) |

(52) U.S. Cl.
CPC .... *H01L 21/02345* (2013.01); *G01R 31/2601* (2013.01); *G01R 31/2851* (2013.01); *G01R 31/2858* (2013.01); *H01L 21/2683* (2013.01); *H01L 22/12* (2013.01); *H01L 22/20* (2013.01); *G01R 31/2831* (2013.01); *G01R 31/311* (2013.01)

(58) Field of Classification Search
CPC ........... H01L 21/02345; H01L 21/2683; H01L 22/12; H01L 22/20; G01R 31/2601; G01R 31/2851
USPC ......................................................... 438/778
See application file for complete search history.

(56) References Cited

U.S. PATENT DOCUMENTS

2018/0091147 A1\* 3/2018 Jansman .............. H03K 19/003

FOREIGN PATENT DOCUMENTS

| JP | 2002005857 A | | 1/2002 |
|---|---|---|---|
| JP | 2007173526 A | | 7/2007 |
| JP | 2007173526 A | \* | 7/2007 |

\* cited by examiner

*Primary Examiner* — David S Blum
(74) *Attorney, Agent, or Firm* — Greer Burns & Crain Ltd.

(57) ABSTRACT

A method of assessing a semiconductor substrate includes a sticking step of sticking a device layer of the semiconductor substrate to a support substrate, a thinning step of thinning the semiconductor substrate from a reverse side thereof to a thickness smaller than a finished thickness after the sticking step is carried out, and an assessing step of applying light to the semiconductor substrate from the reverse side thereof and measuring scattered light from the semiconductor substrate thereby to assess a property of the semiconductor substrate.

7 Claims, 9 Drawing Sheets

METHOD OF ASSESSING SEMICONDUCTOR SUBSTRATE AND METHOD OF ASSESSING DEVICE CHIP

BACKGROUND OF THE INVENTION

Field of the Invention

The present invention relates to a method of assessing a semiconductor substrate to assess a property thereof and a method of assessing a device chip.

Description of the Related Art

It is known in the art that when devices are formed on a semiconductor substrate made of silicon or the like, for example, the surface layer of the semiconductor substrate is distorted under stresses from the devices. Since the distortions of the surface layer tend to affect the electronic characteristics of the devices, there have been demands for measurement of a distribution of distortions (see, for example, Japanese Patent Laid-open No. 2007-173526). Heretofore, according to one method of measuring the properties of the surface layer of a semiconductor substrate that has been distorted, the semiconductor substrate is divided, and light, X-rays, or an electron beam is applied to a cross-sectional surface of the divided piece.

According to the measuring method disclosed in Japanese Patent Laid-open No. 2007-173526, an ultraviolet radiation is applied to a thin film on the surface of a wafer to measure a distortion of the thin film. There has also been proposed a method of applying an electron beam to a semiconductor film on a substrate to measure a crystal orientation of the semiconductor film (see, for example, Japanese Patent Laid-open No. 2002-5857).

SUMMARY OF THE INVENTION

The measuring method in which the semiconductor substrate is divided, and light, X-rays, or an electron beam is applied to a cross-sectional surface of the divided piece is time-consuming and costly because it is necessary to divide the semiconductor substrate, polish a portion of the cross-sectional surface into a flat surface suitable for measurement, thereafter apply light, X-rays, or an electron beam to the polished surface, and then observe the surface with an electron microscope.

The measuring method disclosed in Japanese Patent Laid-open No. 2007-173526 is directed to measuring distortions before devices are formed on the wafer. The measuring method disclosed in Japanese Patent Laid-open No. 2002-5857 thins the substrate until the surface of the semiconductor film is exposed. It is difficult to accurately control the thickness of the substrate in thinning the substrate until the surface of the semiconductor film is exposed.

It is therefore an object of the present invention to provide a method of assessing a semiconductor substrate and a method of assessing a device chip which are capable of reducing the period of time required to measure a property of a surface layer of the semiconductor substrate.

In accordance with a first aspect of the present invention, there is provided a method of assessing a semiconductor substrate with a device layer disposed on a face side thereof to assess a property of a surface layer of the semiconductor substrate, including a sticking step of sticking the device layer of the semiconductor substrate to a support substrate; a thinning step of thinning the semiconductor substrate from a reverse side thereof to a thickness smaller than a finished thickness after the sticking step is carried out; and an assessing step of applying light to the semiconductor substrate from the reverse side thereof and measuring scattered light from the semiconductor substrate thereby to assess the property of the semiconductor substrate.

In accordance with a second aspect of the present invention, there is provided a method of assessing a semiconductor substrate with a device layer disposed on a face side thereof to assess a property of a surface layer of the semiconductor substrate, including a sticking step of sticking the device layer of the semiconductor substrate to a support substrate; a thinning step of thinning the semiconductor substrate from a reverse side thereof to a thickness smaller than a finished thickness after the sticking step is carried out; and an assessing step of applying X-rays to the semiconductor substrate from the reverse side thereof and measuring diffracted X-rays produced as a result of dispersion and interference from the semiconductor substrate thereby to assess the property of the semiconductor substrate.

In the above methods of assessing a semiconductor, the semiconductor substrate may be thinned stepwise by repeating the thinning step and the assessing step.

In the above methods of assessing a semiconductor, the semiconductor substrate may be thinned until distortions of the surface layer of the semiconductor substrate is observed.

In accordance with a third aspect of the present invention, there is provided a method of assessing a device chip divided from a wafer to assess a property of a surface layer of a semiconductor substrate in the device chip, including a sticking step of sticking a device layer disposed on a face side of the semiconductor substrate in the device chip to a support substrate; a thinning step of thinning the semiconductor substrate from a reverse side thereof to a thickness smaller than a finished thickness after the sticking step is carried out; and an assessing step of applying light to the semiconductor substrate from the reverse side thereof and measuring scattered light from the semiconductor substrate thereby to assess the property of the semiconductor substrate.

In accordance with a fourth aspect of the present invention, there is provided a method of assessing a device chip divided from a wafer to assess a property of a surface layer of a semiconductor substrate in the device chip, including a sticking step of sticking a device layer disposed on a face side of the semiconductor substrate in the device chip to a support substrate; a thinning step of thinning the semiconductor substrate from a reverse side thereof to a thickness smaller than a finished thickness after the sticking step is carried out; and an assessing step of applying X-rays to the semiconductor substrate from the reverse side thereof and measuring diffracted X-rays produced as a result of dispersion and interference from the semiconductor substrate thereby to assess the property of the semiconductor substrate.

The methods of assessing a semiconductor substrate and the methods of assessing a device chip according to the above aspects of the present invention are advantageous in that they can reduce the period of time required to measure the property of the surface layer of the semiconductor substrate.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Preferred embodiments of the present invention will be described in detail below with reference to the drawings. The present invention is not limited to the details of the preferred embodiments described below. The components described below cover those which could easily be envisaged by those skilled in the art and those which are essentially identical to those described below. Furthermore, the arrangements described below can be used in appropriate combinations. Various omissions, replacements, or changes of the arrangements may be made without departing from the scope of the present invention.

Embodiment 1

Figure 1:
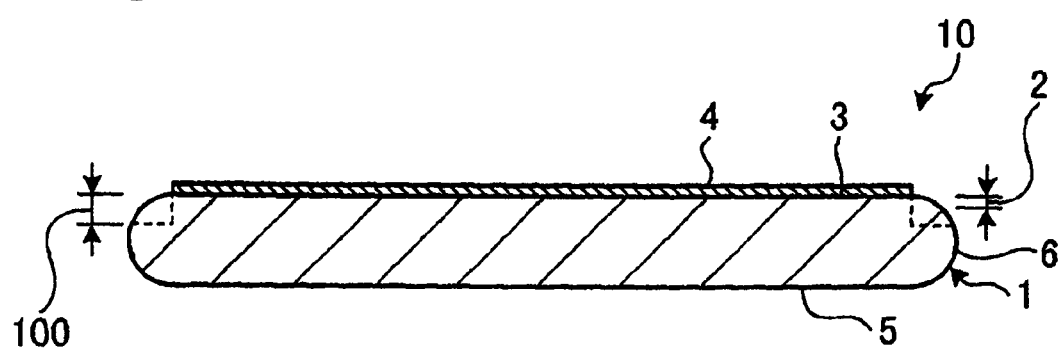
FIG. 1 is a cross-sectional view of a semiconductor substrate as a target to be assessed by a method of assessing a semiconductor substrate according to Embodiment 1.
Figure 2:
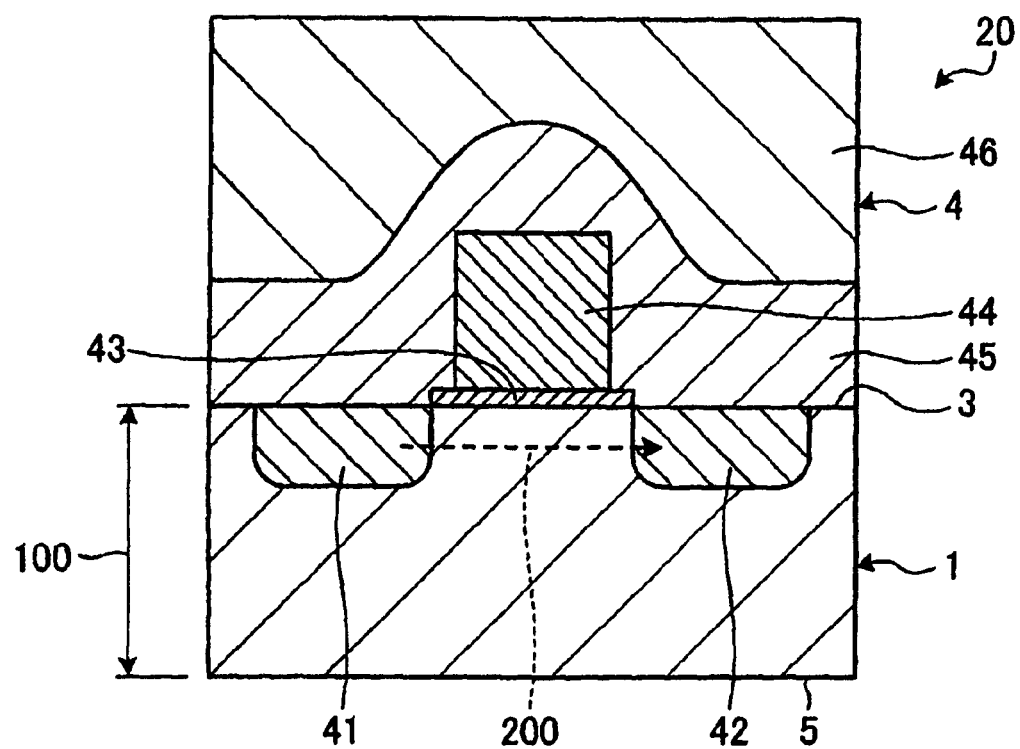
FIG. 2 is a cross-sectional view of a device chip divided from the semiconductor substrate depicted in FIG. 1.
Figure 3:
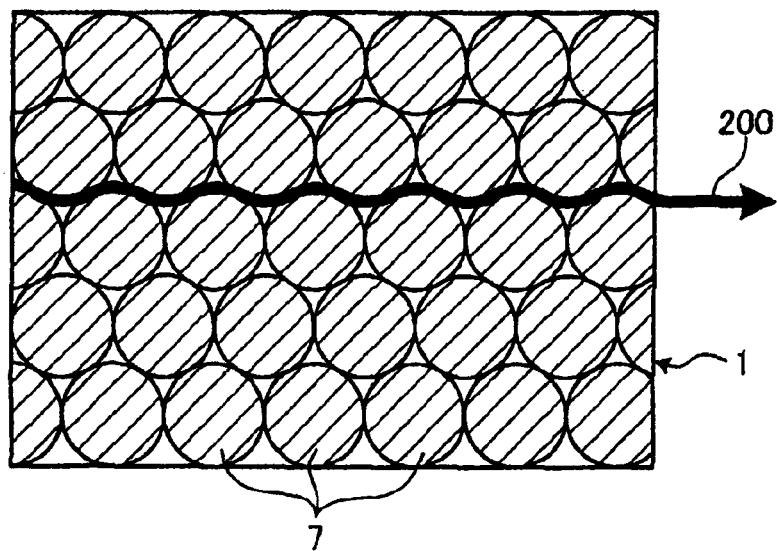
FIG. 3 is a cross-sectional view illustrating a portion of the semiconductor substrate depicted in FIG. 1 which is in an undistorted state.
Figure 4:
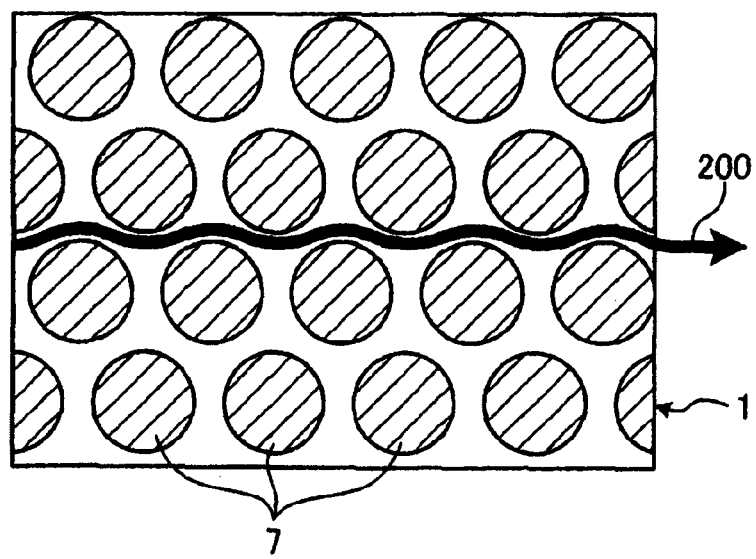
FIG. 4 is a cross-sectional view illustrating a portion of the semiconductor substrate depicted in FIG. 1 which is in a distorted state.
Figure 5:
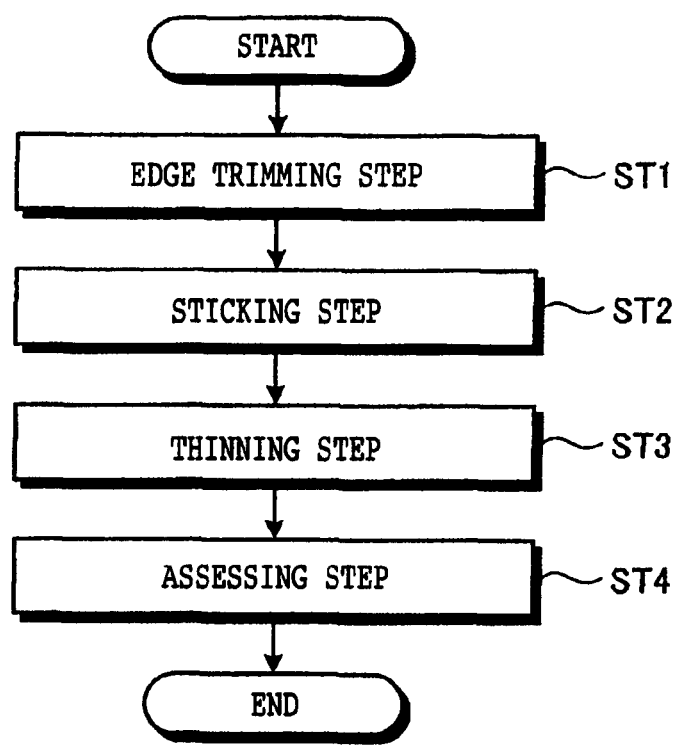
FIG. 5 is a flowchart of the method of assessing a semiconductor substrate according to Embodiment 1.

A method of assessing a semiconductor substrate according to Embodiment 1 of the present invention will be described with reference to the drawings. FIG. 1 is a cross-sectional view of a semiconductor substrate as a target to be assessed by the method of assessing a semiconductor substrate according to Embodiment 1. FIG. 2 is a cross-sectional view of a device chip divided from the semiconductor substrate depicted in FIG. 1. FIG. 3 is a cross-sectional view illustrating a portion of the semiconductor substrate depicted in FIG. 1 which is in an undistorted state. FIG. 4 is a cross-sectional view illustrating a portion of the semiconductor substrate depicted in FIG. 1 which is in a distorted state. FIG. 5 is a flowchart of the method of assessing a semiconductor substrate according to Embodiment 1.

The method of assessing a semiconductor substrate according to Embodiment 1 refers to a method of measuring a property of a surface layer 2 of a semiconductor substrate 1 depicted in FIG. 1, and is used to assess distortions of the surface layer 2, for example. The semiconductor substrate 1 is a disk-shaped substrate made of a base material such as silicon, SiC (silicon carbide), sapphire, GaAs (gallium arsenide), GaN (gallium nitride), or the like, and has a device layer 4 on a face side 3 thereof. The semiconductor substrate 1 with the device layer 4 on the face side 3 thereof serves as a wafer 10 such as a semiconductor wafer, an optical device wafer, or the like. According to the present invention, the semiconductor substrate 1 covers a semiconductor substrate made of only a base material such as silicon, SiC, sapphire, GaAs, GaN, or the like, and a semiconductor substrate made of the base material referred to above and an epitaxial layer deposited as a single crystal layer of silicon to several μm on the base material by vapor phase epitaxy.

The device layer 4 includes a layer of power devices, ICs (Integrated Circuits), LSI (Large Scale Integration) circuits, various memories, CCDs (Charge Coupled Devices), or MEMS (Micro Electro Mechanical Systems). According to Embodiment 1, the device layer 4 includes a field-effect transistor that has, as depicted in FIG. 2, a source 41 and a drain 42 disposed in the semiconductor substrate 1, a gate oxide film 43 disposed on the source 41, the drain 42, and the face side 3 of the semiconductor substrate 1, a gate 44 disposed on the gate oxide film 43, a film 45 covering the gate 44 and the face side 3 of the semiconductor substrate 1, and an oxide film 46 covering the film 45. However, the device layer 4 is not limited to such a field-effect transistor.

As depicted in FIG. 1, the wafer 10 has a beveled outer circumferential edge 6 having an arcuate cross-sectional shape extending from the face side 3 to a reverse side 5 thereof. The wafer 10 is processed by removing a fully circumferential portion of the beveled outer circumferential edge 6 from the face side 3 as indicated by the dotted lines in FIG. 1, and then grinding and polishing the reverse side 5 until the semiconductor substrate 1 is thinned to a finished thickness 100. Then, the wafer 10 is divided along projected dicing lines, not depicted, into individual device chips 20, one depicted in FIG. 2. As depicted in FIG. 2, each of the device chips 20 includes a fraction of the semiconductor substrate 1 and a fraction of the device layer 4.

When the device layer 4 is formed on the semiconductor substrate 1, the surface layer 2 is distorted, increasing the spacing between atoms 7 prior to the formation of the device layer 4 as depicted in FIG. 3 to the spacing between atoms 7 subsequent to the formation of the device layer 4 as depicted in FIG. 4. Therefore, the semiconductor substrate 1 allows electrons 200 to flow more easily therein after the device layer 4 is formed than before the device layer 4 is formed, and has its electronic characteristics changed after the device layer 4 is formed. The surface layer 2 of the semiconductor substrate 1 according to the present invention refers to a layer extending to a depth of approximately 10 μm or less from the face side 3 on which the device layer 4 is formed, or stated otherwise represents a layer that is distorted when the device layer 4 is formed on the semiconductor substrate 1.

The method of assessing a semiconductor substrate according to Embodiment 1 refers to a method of assessing distortions developed in the surface layer 2 of the semiconductor substrate 1 when the device layer 4 is formed on the surface side 3 of the semiconductor substrate 1 and also a method of measuring at an arbitrary position in the semiconductor substrate 1 an amount of distortion or a magnitude of distortion that represents a property of distortions that occur in the surface layer 2 of the semiconductor substrate 1 when the device layer 4 is formed thereon. As depicted in FIG. 5, the method of assessing a semiconductor substrate includes an edge trimming step ST1, a sticking step ST2, a thinning step ST3, and an assessing step ST4.

(Edge Trimming Step)

Figure 6:
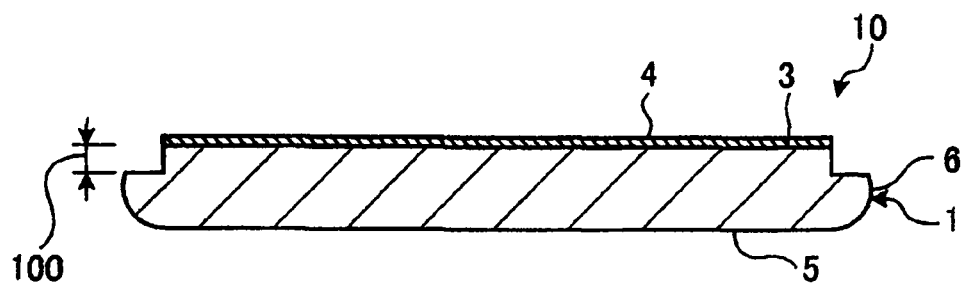
FIG. 6 is a cross-sectional view of the semiconductor substrate after an edge trimming step of the method of assessing a semiconductor substrate depicted in FIG. 5.

FIG. 6 is a cross-sectional view of the semiconductor substrate 1 after an edge trimming step of the method of assessing a semiconductor substrate depicted in FIG. 5. The edge trimming step ST1 is the step of performing an edge trimming process on the semiconductor substrate 1 by causing the cutting blade of a cutting apparatus, not depicted, to cut into the semiconductor substrate 1 and rotating the semiconductor substrate 1, thereby performing a circular cutting process on the semiconductor substrate 1 to remove a fully circumferential portion from the face side 3 of the beveled outer circumferential edge 6 of the semiconductor substrate 1.

In the edge trimming step ST1, the reverse side 5 of the semiconductor substrate 1 is held under suction on the chuck table of the cutting apparatus, not depicted, the cutting blade is caused to cut into the beveled outer circumferential edge 6 from the face side 3, and the chuck table is rotated about its own axis. After the fully circumferential portion has been removed across a thickness corresponding to the finished thickness 100 from the face side 3 of the beveled outer circumferential edge 6 in the edge trimming step ST1, as depicted in FIG. 6, the sticking step ST2 of the method of assessing a semiconductor substrate is carried out.

(Sticking Step)

Figure 7:
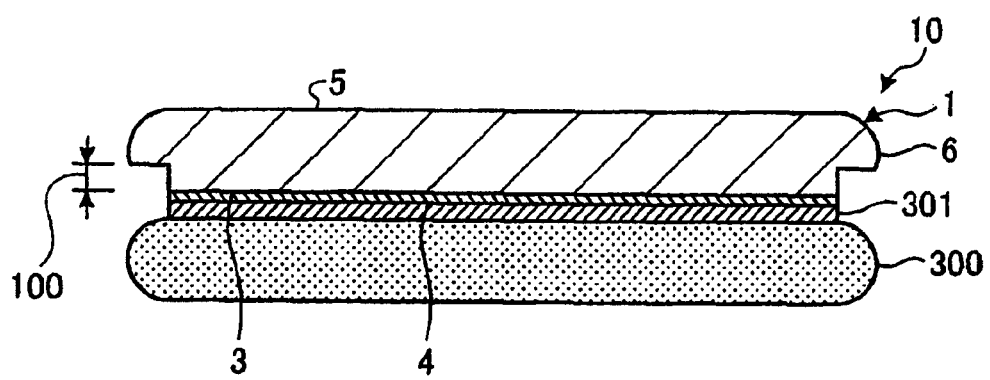
FIG. 7 is a cross-sectional view of the semiconductor substrate after a sticking step of the method of assessing a semiconductor substrate depicted in FIG. 5.

FIG. 7 is a cross-sectional view of the semiconductor substrate after a sticking step of the method of assessing a semiconductor substrate depicted in FIG. 5. The sticking step ST2 is the step of sticking the device layer 4 on the semiconductor substrate 1 to a support substrate 300. In the sticking step ST2, the support substrate 300 that is made of silicon or glass and is of a disk shape which is of substantially the same diameter as the semiconductor substrate 1 is prepared. According to Embodiment 1, in the sticking step ST2, the device layer 4 on the semiconductor substrate 1 is stuck to the support substrate 300 using an adhesive 301 as depicted in FIG. 7. According to the present invention, the device layer 4 on the semiconductor substrate 1 may be stuck to the support substrate 300 using other means than the adhesive 301. After the support substrate 300 has been stuck to the semiconductor substrate 1, the thinning step ST3 of the method of assessing a semiconductor substrate is carried out.

(Thinning Step)

Figure 8:
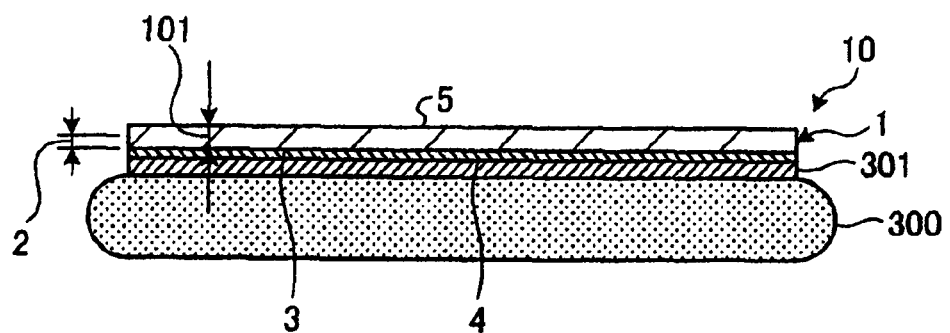
FIG. 8 is a cross-sectional view of the semiconductor substrate after a thinning step of the method of assessing a semiconductor substrate depicted in FIG. 5.

FIG. 8 is a cross-sectional view of the semiconductor substrate after a thinning step of the method of assessing a semiconductor substrate depicted in FIG. 5. The thinning step ST3 is the step of thinning the semiconductor substrate 1 to a thickness smaller than the finished thickness 100 after the sticking step ST2 is carried out. According to Embodiment 1, in the thinning step ST3, the support substrate 300 is held under suction on a chuck table, not depicted, and then a rough grinding process, a finished grinding process, and a CMP (Chemical Mechanical Polishing) process are successively performed on the reverse side 5 of the semiconductor substrate 1, thereby thinning the semiconductor substrate 1 to a thickness smaller than the finished thickness 100 to remove the beveled outer circumferential edge 6 and planarize the reverse side 5, as depicted in FIG. 8. According to Embodiment 1, the CMP process is performed finally in the thinning step ST3. According to the present invention, a plasma etching process rather than the CMP process may be performed on the semiconductor substrate 1.

According to Embodiment 1, in the thinning step ST3, the semiconductor substrate 1 is thinned until its thickness becomes equal to or smaller than a thickness 101 that allows the distortions of the surface layer 2 to be observed.

(Assessing Step)

Figure 9:
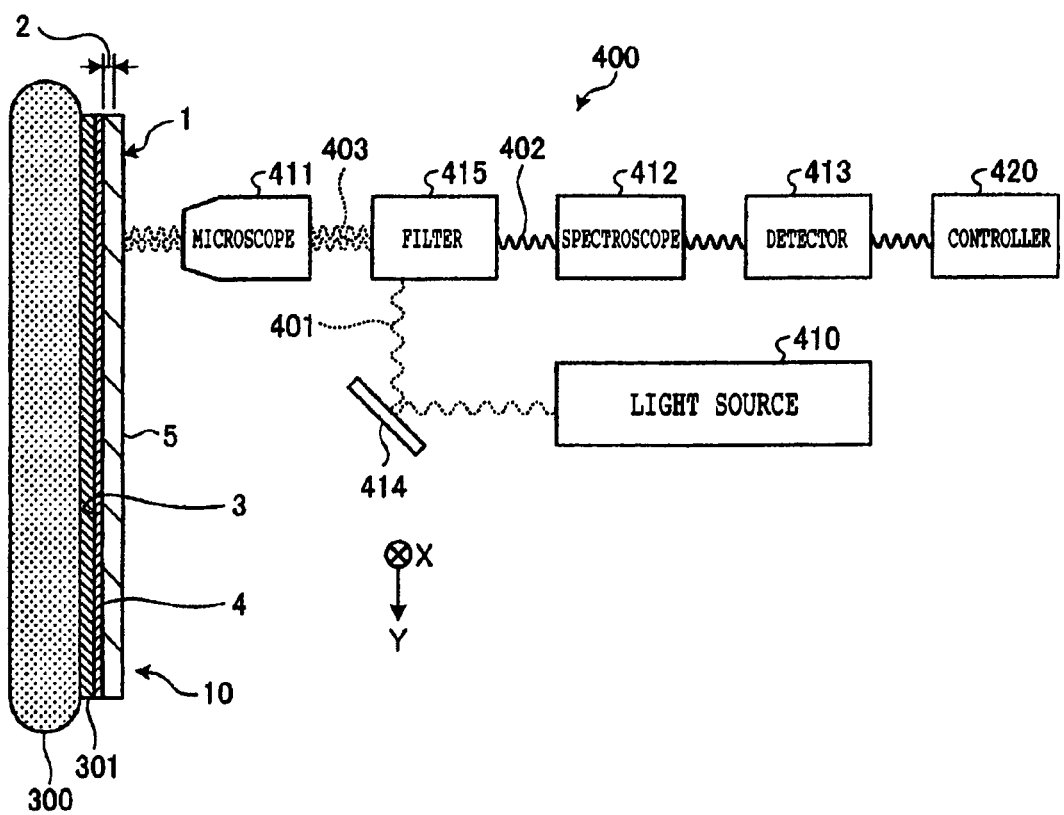
FIG. 9 is a schematic view illustrating an outline of an assessing step of the method of assessing a semiconductor substrate depicted in FIG. 5.
Figure 10:
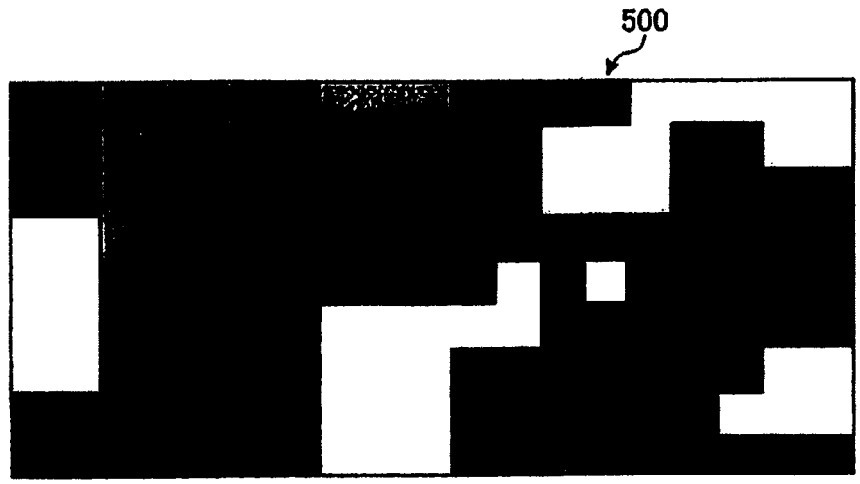
FIG. 10 is a diagram illustrating an image of distortions of a portion of the semiconductor substrate, obtained in the assessing step of the method of assessing a semiconductor substrate depicted in FIG. 5.

FIG. 9 is a schematic view illustrating an outline of an assessing step of the method of assessing a semiconductor substrate depicted in FIG. 5. FIG. 10 is a diagram illustrating an image of distortions of a portion of the semiconductor substrate, obtained in an assessing step of the method of assessing a semiconductor substrate depicted in FIG. 5.

The assessing step ST4 is the step of assessing an amount of distortion of the semiconductor substrate 1 by applying light from a light source 410 to the reverse side 5 of the semiconductor substrate 1 and measuring Raman scattered light 402 therefrom. According to Embodiment 1, in the assessing step ST4, a laser beam 401 having a wavelength of 266 nm is applied as the light to the reverse side 5 of the semiconductor substrate 1. According to the present invention, however, the light is not limited to the laser beam 401, but a laser beam having a wavelength of 514 nm, 488 nm, or 458 nm, for example, may be applied to the reverse side 5. If the semiconductor substrate 1 is made of silicon, then a laser beam having a wavelength of 514 nm, 488 nm, 458 nm, or 266 nm that is applied to the reverse side 5 enters the semiconductor substrate 1 by each depth of 800 nm, 600 nm, 500 nm, or 10 nm from the reverse side 5. The thickness 101 to which the semiconductor substrate 1 is thinned allows distortions in the surface layer 2 to be assessed without making the surface layer 2 exposed, in the presence of the added depth to which the laser beam 401 from the light source 410 enters the semiconductor substrate 1.

According to Embodiment 1, the assessing step ST4 is carried out using a Raman spectroscopy apparatus 400 depicted in FIG. 9. The Raman spectroscopy apparatus 400 includes the light source 410 for exciting the laser beam 401, a microscope 411 disposed in facing relation to the reverse side 5 of the semiconductor substrate 1, a spectroscope 412, a detector 413, a reflecting mirror 414, a filter 415, a relative actuator, not depicted, and a controller 420.

The light source 410 applies the excited laser beam 401 to the microscope 411 via the reflecting mirror 414 and the filter 415. The reflecting mirror 414 reflects the laser beam 401 toward the filter 415. The filter 415 reflects the laser beam 401 from the light source 410 toward the microscope 411, and transmits only Raman scattered light 402 therethrough that is included in reflected light 403 from the reverse side 5 of the semiconductor substrate 1 being irradiated with the laser beam 401. The reflected light 403 from the reverse side 5 of the semiconductor substrate 1 includes the Raman scattered light 402 having a different energy level depending on the amount of distortion in the area of the reverse side 5 that is irradiated with the laser beam 401. The filter 415 serves to cut off Rayleigh scattered light included in the reflected light 403. The microscope 411 focuses the laser beam 401 into a laser beam spot that is approximately 3 µm across on the reverse side 5.

The spectroscope 412, which serves to spectralize the Raman scattered light 402, includes a polychromator combined with a diffractive grating. The detector 413, which serves to detect the Raman scattered light 402 spectralized by the spectroscope 412, includes a CCD. The detector 413 outputs the detected result from the CCD to the controller 420. The relative actuator moves at least the microscope 411 and the semiconductor substrate 1 relatively along an X-axis parallel to the reverse side 5 and a Y-axis parallel to the reverse side 5 and perpendicular to the X-axis.

The controller 420 controls the components of the Raman spectroscopy apparatus 400. Specifically, the controller 420 controls the relative actuator to move the microscope 411 and the semiconductor substrate 1 relatively along the X-axis and the Y-axis, controls the light source 410 to apply the laser beam 401 to the reverse side 5 of the semiconductor substrate 1, and controls the detector 413 to detect the Raman scattered light 402. According to Embodiment 1, the controller 420 controls the detector 413 to detect the Raman scattered light 402 from the entire reverse side 5. According to the present invention, the controller 420 may control the detector 413 to detect the Raman scattered light 402 from any desired position on the reverse side 5.

The controller 420 calculates an amount of distortion at each of positions on the surface layer 2 of the semiconductor substrate 1 based on the Raman scattered light 402 detected by the detector 413, and stores the calculated amount of distortion together with the position on the surface layer 2. The controller 420 includes a computer having a processing apparatus having a microprocessor such as a CPU (Central Processing Unit), a storage apparatus having memories including a ROM (Read Only Memory) and a RAM (Random Access Memory), and an input/output interface. The processing apparatus of the controller 420 performs processing sequences according to computer programs stored in the storage apparatus and outputs control signals for controlling the relative actuator and the light source 410 through the input/output interface.

The controller 420 is connected to a display unit, not depicted, for displaying an image 500 depicted in FIG. 10 that represents amounts of distortion of the semiconductor substrate 1, and an input unit, not depicted, that the operator uses in registering various items of information. The display unit includes a liquid crystal display apparatus, for example. The input unit includes at least either a touch panel included in the display unit or an external input apparatus such as a keyboard or the like. The image 500 depicted in FIG. 10 is made up of a plurality of areas each representing a grayscale that is darker as the amount of distortion indicated thereby is larger and lighter as the amount of distortion indicated thereby is smaller.

In the assessing step ST4, the controller 420 of the Raman spectroscopy apparatus 400 controls the relative actuator to move the microscope 411 and the semiconductor substrate 1 relatively along the X-axis and the Y-axis, and controls the light source 410 to apply the laser beam 401 to the reverse side 5 of the semiconductor substrate 1, calculates an amount of distortion at each of positions on the surface layer 2 of the semiconductor substrate 1, and stores the calculated amount of distortion together with the position on the surface layer 2. The method of assessing a semiconductor substrate is finished when the Raman spectroscopy apparatus 400 has measured an amount of distortion at each of positions on the surface layer 2 of the semiconductor substrate 1 as a target to be assessed by the method.

With the method of assessing a semiconductor substrate according to Embodiment 1, since the semiconductor substrate 1 is thinned from the reverse side 5 to a thickness smaller than the finished thickness 100 in the thinning step ST3, amounts of distortion caused in the surface layer 2 of the semiconductor substrate 1 when the device layer 4 was formed thereon can be measured and assessed using the laser beam 401 applied to the semiconductor substrate 1 from the reverse side 5 in the assessing step ST4. As a result, the method of assessing a semiconductor substrate according to Embodiment 1 can measure amounts of distortion in the surface layer 2 at any arbitrary positions on the reverse side 5, making it possible to reduce the period of time required to measure distortions caused in the surface layer 2 at the time the device layer 4 was formed thereon.

With the method of assessing a semiconductor substrate according to Embodiment 1, since amounts of distortion in the surface layer 2 at any arbitrary positions on the reverse side 5 can be measured, by measuring amounts of distortion of the reverse side 5 in its entirety, it is possible to obtain a two-dimensional distribution of amounts of distortion caused in the surface layer 2 of the semiconductor substrate 1 at the time the device layer 4 was formed thereon.

Furthermore, since the method of assessing a semiconductor substrate according to Embodiment 1 is able to obtain a two-dimensional distribution of amounts of distortion caused in the surface layer 2 of the semiconductor substrate 1 at the time the device layer 4 was formed thereon, the method of assessing a semiconductor substrate according to Embodiment 1 can grasp the electronic characteristics of the device layer 4. It is possible to control the two-dimensional distribution of amounts of distortion in the surface layer 2 of the semiconductor substrate 1, i.e., the electronic characteristics of the device layer 4, by changing the pattern of the device layer 4.

Moreover, with the method of assessing a semiconductor substrate according to Embodiment 1, the semiconductor substrate 1 is thinned until its reduced thickness allows the distortions of the surface layer 2 to be observed from the reverse side 5 in the thinning step ST3. Consequently, amounts of distortion caused in the surface layer 2 of the semiconductor substrate 1 at the time the device layer 4 was formed thereon can accurately be measured and assessed. The method of assessing a semiconductor substrate according to Embodiment 1 is characterized in that the semiconductor substrate 1 is thinned to the thickness 101 that allows distortions in the surface layer 2 to be measured. Therefore, distortions in the surface layer 2 can sufficiently be measured by thinning the semiconductor substrate 1 to the thickness 101 by taking the depth to which the laser beam 401 enters the semiconductor substrate 1 into account, without actually making the surface layer 2 exposed to the reverse side 5. As the method of assessing a semiconductor substrate according to Embodiment 1 allows distortions in the surface layer 2 to be measured without exposing the surface layer 2 as a target to be measured, it is possible to thin the semiconductor substrate 1 more easily and to measure distortions in the surface layer 2 more easily than if the surface layer 2 as a target to be measured is fully exposed.

Embodiment 2

Figure 11:
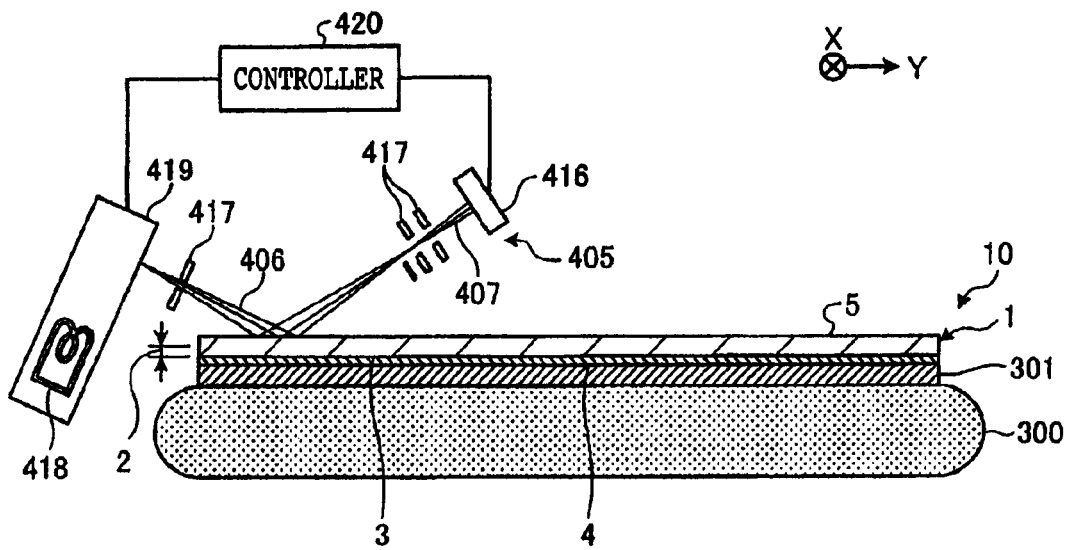
FIG. 11 is a schematic view illustrating an outline of an assessing step of a method of assessing a semiconductor substrate according to Embodiment 2.

A method of assessing a semiconductor substrate according to Embodiment 2 of the present invention will be described below with referenced to the drawings. FIG. 11 is a schematic view illustrating an outline of an assessing step of the method of assessing a semiconductor substrate according to Embodiment 2. Those parts depicted in FIG. 11 which are identical to those according to Embodiment 1 are denoted by identical reference characters, and will not be described in detail below.

The method of assessing a semiconductor substrate according to Embodiment 2 is similar to the method of assessing a semiconductor substrate according to Embodiment 1 except that amounts of distortion in the surface layer 2 of the semiconductor substrate 1 are measured and assessed using an X-ray diffraction apparatus 405 depicted in FIG. 11 in the assessing step ST4.

The X-ray diffraction apparatus 405 depicted in FIG. 11 is an apparatus for applying X-rays 406 as an electromagnetic wave having a wavelength ranging from approximately 1 µm to 10 nm to the semiconductor substrate 1 from the reverse side 5 and measuring diffracted X-rays 407 produced as a result of dispersion and interference of the applied X-rays 406. Specifically, the assessing step ST4 of the method of assessing a semiconductor substrate according to Embodiment 2 is the step of assessing amounts of distortion of the semiconductor substrate 1 by measuring diffracted X-rays 407 produced as a result of dispersion and interference of the X-rays 406 applied to the semiconductor substrate 1 from the reverse side 5.

The X-ray diffraction apparatus 405 includes diffraction gratings 417, an X-ray tube bulb 418 for generating the X-rays 406, a goniometer 419 for measuring angles, a detector 416 for detecting the diffracted X-rays 407, a relative actuator, not depicted, and a controller 420. The X-rays 406 generated by the X-ray tube bulb 418 are applied through one of the diffraction gratings 417 to the reverse side 5 of the semiconductor substrate 1. The X-rays 406 applied to the reverse side 5 of the semiconductor substrate 1 are dispersed and interfere with each other, producing the diffracted X-rays 407.

The goniometer 419 measures an angle between the reverse side 5 of the semiconductor substrate 1 and the X-rays 406 applied to the reverse side 5, and outputs the measured angle to the controller 420. The detector 416 detects the diffracted X-rays 407 through the other diffraction gratings 417, and includes a CCD. The detector 416 outputs the detected result from the CCD to the controller 420. The relative actuator moves at least the X-ray tube bulb 418 and the semiconductor substrate 1 relatively along an X-axis parallel to the reverse side 5 and a Y-axis parallel to the reverse side 5 and perpendicular to the X-axis.

The controller 420 controls the components of the X-ray diffraction apparatus 405. Specifically, the controller 420 controls the relative actuator to move the X-ray tube bulb 418 and the semiconductor substrate 1 relatively along the X-axis and the Y-axis, controls the X-ray tube bulb 418 to apply the X-rays 406 to the reverse side 5 of the semiconductor substrate 1, and controls the detector 416 to detect the diffracted X-rays 407. According to Embodiment 2, the controller 420 controls the detector 416 to detect the diffracted X-rays 407 from the entire reverse side 5. According to the present invention, the controller 420 may control the detector 416 to detect the diffracted X-rays 407 from any desired position on the reverse side 5. The controller 420 calculates an amount of distortion at each of positions on the surface layer 2 of the semiconductor substrate 1 based on the diffracted X-rays 407 detected by the detector 416, and stores the calculated amount of distortion together with the position on the surface layer 2.

In the assessing step ST4 of the method of assessing a semiconductor substrate according to Embodiment 2, the controller 420 of the X-ray diffraction 405 controls the relative actuator to move the X-ray tube bulb 418 and the semiconductor substrate 1 relatively along the X-axis and the Y-axis, and controls the X-ray tube bulb 418 to apply the X-rays 406 to the reverse side 5 of the semiconductor substrate 1, calculates an amount of distortion at each of positions on the surface layer 2 of the semiconductor substrate 1, and stores the calculated amount of distortion together with the position on the surface layer 2. The method of assessing a semiconductor substrate is finished when the X-ray diffraction apparatus 405 has measured an amount of distortion at each of positions on the surface layer 2 of the semiconductor substrate 1 as a target to be assessed by the method.

With the method of assessing a semiconductor substrate according to Embodiment 2, since the semiconductor substrate 1 is thinned to a thickness smaller than the finished thickness 100 in the thinning step ST3, amounts of distortion caused in the surface layer 2 of the semiconductor substrate 1 can be measured and assessed using the X-rays 406 applied to the semiconductor substrate 1 from the reverse side 5 in the assessing step ST4. As a result, the method of assessing a semiconductor substrate according to Embodiment 2 can measure amounts of distortion in the surface layer 2 at any arbitrary positions on the reverse side 5, making it possible to reduce the period of time required to measure distortions in the surface layer 2, as with Embodiment 1. With the method of assessing a semiconductor substrate according to Embodiment 2, distortions in the surface layer 2 can sufficiently be measured by thinning the semiconductor substrate 1 to the thickness 101 by taking the depth to which the X-rays 406 enter the semiconductor substrate 1 into account, without actually making the surface layer 2 exposed to the reverse side 5. As with Embodiment 1, it is thus possible to thin the semiconductor substrate 1 more easily and to measure distortions in the surface layer 2 more easily than if the surface layer 2 as a target to be measured is fully exposed.

[Modifications]

Figure 12:
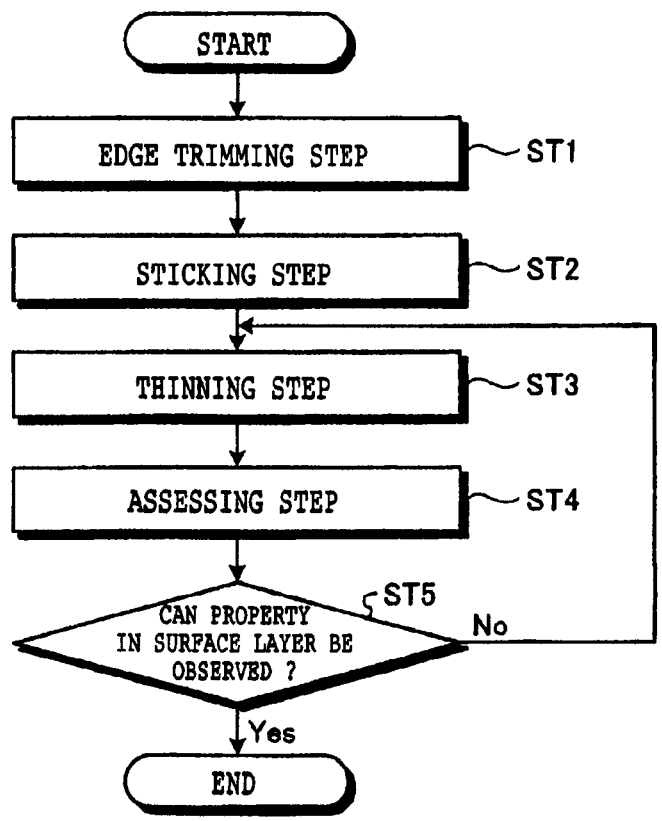
FIG. 12 is a flowchart of a method of assessing a semiconductor substrate according to a modification of Embodiment 1 and Embodiment 2.

A method of assessing a semiconductor substrate according to a modification of Embodiment 1 and Embodiment 2 of the present invention will be described below with reference to the drawings. FIG. 12 is a flowchart of the method of assessing a semiconductor substrate according to the modification of Embodiment 1 and Embodiment 2. Those steps depicted in FIG. 12 which are identical to those according to Embodiment 1 and Embodiment 2 are denoted by identical reference symbols, and will not be described in detail below.

With the method of assessing a semiconductor substrate according to the modification, the semiconductor substrate 1 is thinned to a thickness of 10 µm at which the surface layer 2 starts to appear on the reverse side 5 in the thinning step ST3, and amounts of distortion are measured and assessed in the assessing step ST4 in the same manner as with Embodiment 1 and Embodiment 2.

With the method of assessing a semiconductor substrate according to the modification, it is determined in the assessing step ST4 whether distortions in the surface layer 2 can be observed or not (step ST5). If it is determined that distortions in the surface layer 2 cannot be observed (step ST5: No), then the thinning step ST3 is carried again. In the returned thinning step ST3, the semiconductor substrate 1 is thinned by CMP or plasma etching. Then, in the assessing step ST4, amounts of distortion are measured and assessed in the same manner as with Embodiment 1 and Embodiment 2. The method of assessing a semiconductor substrate according to the modification is finished if distortions in the surface layer 2 can be observed (step ST5: Yes) in the assessing step ST4.

With the method of assessing a semiconductor substrate according to the modification, the thinning step ST3 and the assessing step ST4 are repeated until distortions in the surface layer 2 can be observed from the reverse side 5. The semiconductor substrate 1 is thus thinned stepwise and amounts of distortion are measured in each of the steps.

With the method of assessing a semiconductor substrate according to the modification, since the semiconductor substrate 1 is thinned to a thickness smaller than the finished thickness 100 in the thinning step ST3, amounts of distortion in the surface layer 2 of the semiconductor substrate 1 can be measured and assessed using the laser beam 401 or the X-rays 406 applied to the semiconductor substrate 1 from the reverse side 5 in the assessing step ST4. As a result, the method of assessing a semiconductor substrate according to the modification can measure amounts of distortion in the surface layer 2 at any arbitrary positions on the reverse side 5 as with Embodiment 1, making it possible to reduce the period of time required to measure distortions in the surface layer 2 of the semiconductor substrate 1.

Furthermore, with the method of assessing a semiconductor substrate according to the modification, the thinning step ST3 and the assessing step ST4 are repeated until distortions in the surface layer 2 can be observed from the reverse side 5, so that the semiconductor substrate 1 is thinned stepwise and amounts of distortion are measured in each of the steps. Therefore, inasmuch as distortions can be measured without exposing the surface layer 2 as a target to be measured, amounts of distortion in the surface layer 2 can be grasped more easily than if the surface layer 2 as a target to be measured is fully exposed.

Embodiment 3

Figure 13:
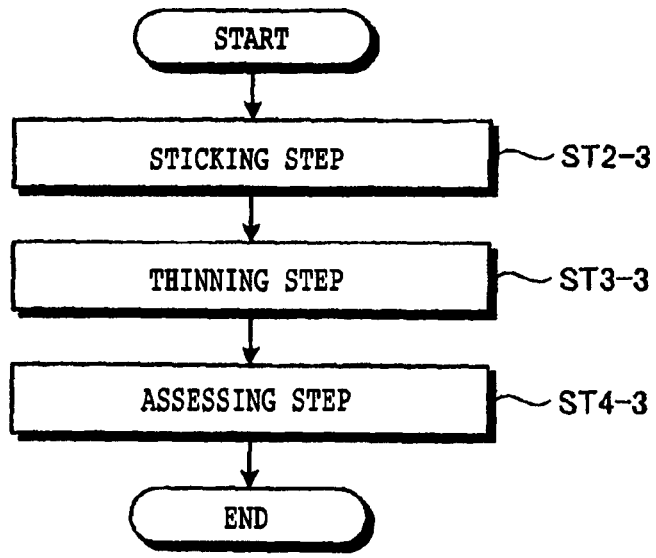
FIG. 13 is a flowchart of a method of assessing a device chip according to Embodiment 3.
Figure 14:
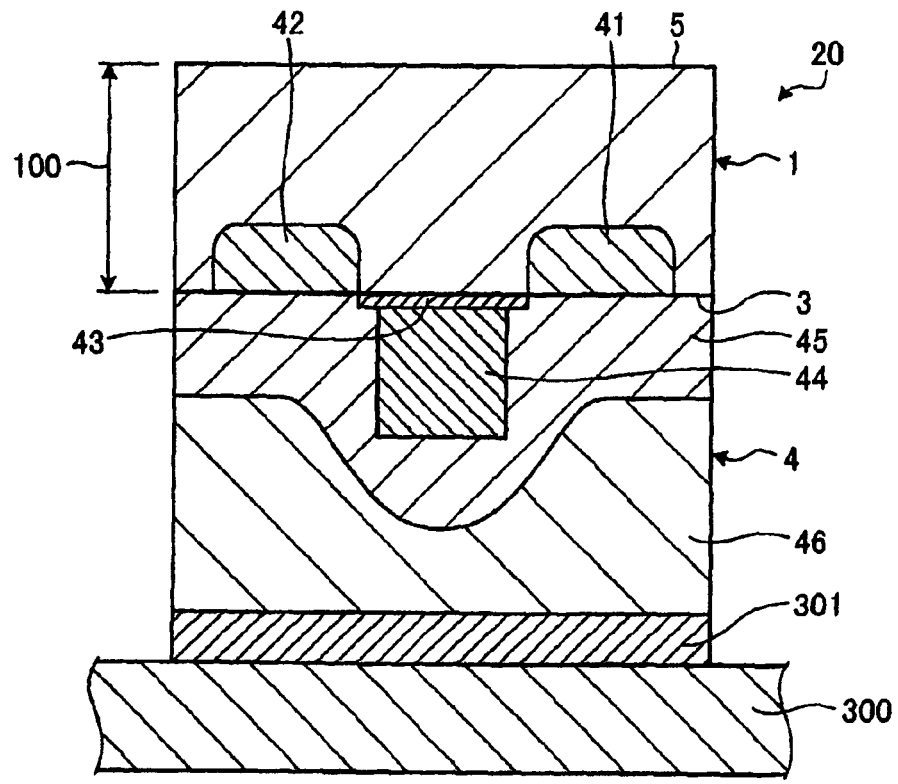
FIG. 14 is a cross-sectional view of a device chip after a sticking step of the method of assessing a device chip depicted in FIG. 13.
Figure 15:
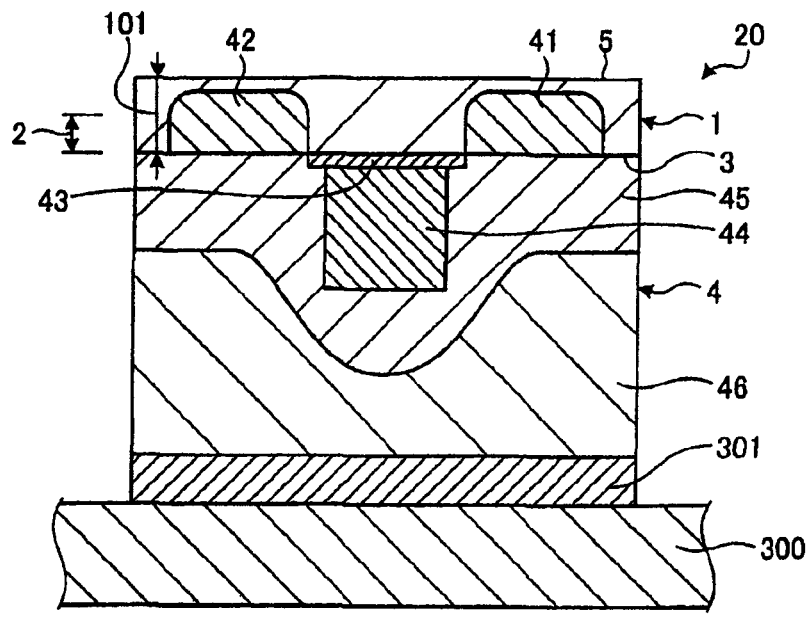
FIG. 15 is a cross-sectional view of the device chip after a thinning step of the method of assessing a device chip depicted in FIG. 13.
Figure 16:
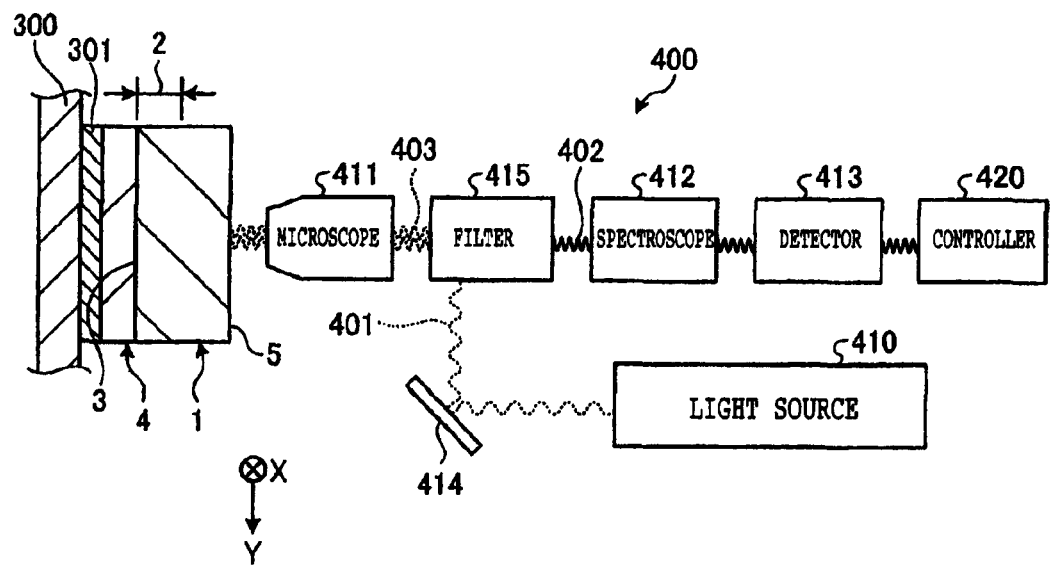
FIG. 16 is a schematic view illustrating an outline of an assessing step of the method of assessing a device chip depicted in FIG. 13.
Figure 17:
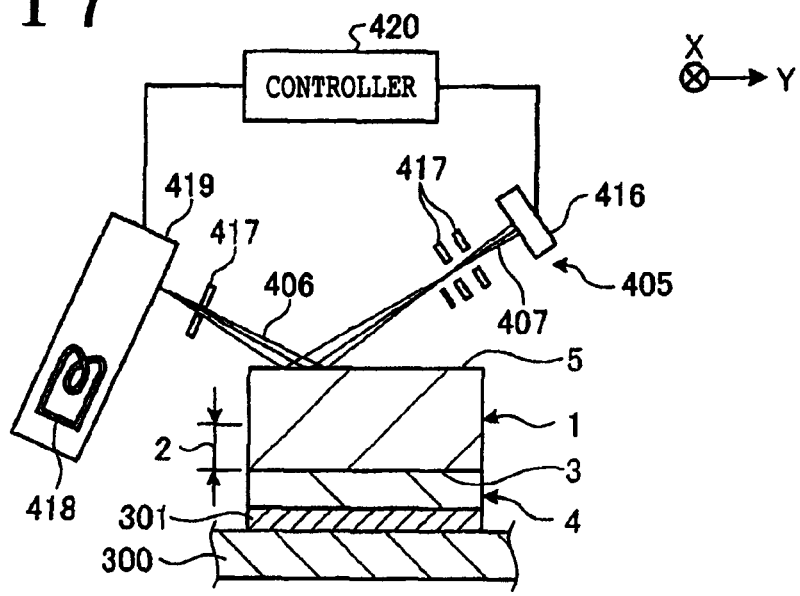
FIG. 17 is a schematic view illustrating an outline of a modification of the assessing step of the method of assessing a device chip according to Embodiment 3 depicted in FIG. 16.
Figure 18:
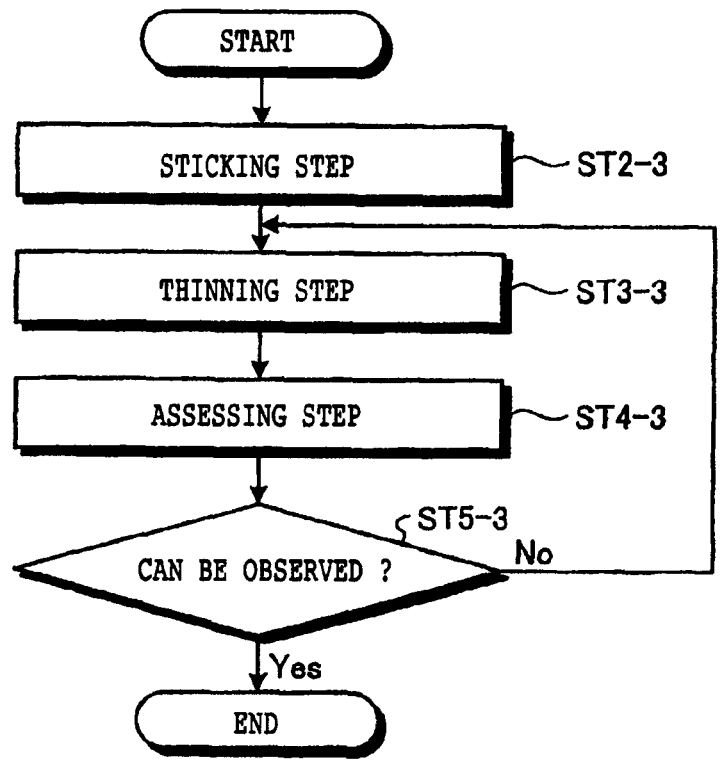
FIG. 18 is a flowchart of a method of assessing a device chip according to a modification of Embodiment 3.

A method of assessing a device chip according to Embodiment 3 of the present invention will be described below with reference to the drawings. FIG. 13 is a flowchart of the method of assessing a device chip according to Embodiment 3. FIG. 14 is a cross-sectional view of a device chip after a sticking step of the method of assessing a device chip depicted in FIG. 13. FIG. 15 is a cross-sectional view of the device chip after a thinning step of the method of assessing a device chip depicted in FIG. 13. FIG. 16 is a schematic view illustrating an outline of an assessing step of the method of assessing a device chip depicted in FIG. 13. FIG. 17 is a schematic view illustrating an outline of a modification of the assessing step of the method of assessing a device chip according to Embodiment 3 depicted in FIG. 16. FIG. 18 is a flowchart of a method of assessing a device chip according to a modification of Embodiment 3. Those parts depicted in FIGS. 13 through 18 which are identical to those according to Embodiment 1, Embodiment 2, and the modification thereof are denoted by identical reference symbols, and will not be described in detail below.

The method of assessing a device chip according to Embodiment 3 is a method of measuring the properties of the semiconductor substrate 1 to measure and assess the properties of the surface layer 2 of the semiconductor substrate 1 in the device chip 20 depicted in FIG. 2, which is divided from the wafer 10 depicted in FIG. 1, and is used to assess distortions in the surface layer 2. For example, the method of assessing a device chip according to Embodiment 3 is a method of assessing distortions caused in the surface layer 2 of the semiconductor substrate 1 when the device layer 4 was formed on the face side 3 and also a method of measuring amounts of distortion that represent characteristics of distortions caused in the surface layer 2 of the semiconductor substrate 1 when the device layer 4 was formed thereon, at any arbitrary positions on the semiconductor substrate 1.

As depicted in FIG. 13, the method of assessing a device chip includes a sticking step ST2-3, a thinning step ST3-3, and an assessing step ST4-3.

(Sticking Step)

The sticking step ST2-3 is the step of sticking the device layer 4 of the device chip 20 to a support substrate 300. In the sticking step ST2-3, the support substrate 300 that is made of silicon or glass and is larger than the device chip 20 is prepared. According to Embodiment 3, in the sticking step ST2-3, the device layer 4 of the device chip 20 is stuck to the support substrate 300 using an adhesive 301, as depicted in FIG. 14. According to the present invention, the device layer 4 of the device chip 20 may be stuck to the support substrate 300 using other means than the adhesive 301. According to Embodiment 3, the adhesive 301 has a thickness ranging from 5 to 10 µm. After the support substrate 300 has been stuck to the device chip 20, the thinning step ST3-3 is carried out.

(Thinning Step)

The thinning step ST3-3 is the step of thinning the semiconductor substrate 1 to a thickness smaller than the finished thickness 100 after the sticking step ST2-3. According to Embodiment 3, in the thinning step ST3-3, the semiconductor substrate 1 is thinned until its thickness becomes equal to or smaller than a thickness 101 that allows the distortions of the surface layer 2 to be observed, as depicted in FIG. 15, as with Embodiment 1.

(Assessing Step)

The assessing step ST4-3 is the step of assessing an amount of distortion or a magnitude of distortion of the semiconductor substrate 1 by measuring Raman scattered light 402 scattered from the semiconductor substrate 1 when a laser beam 401 is applied as light to the semiconductor substrate 1 from the reverse side 5 thereof. According to Embodiment 3, the Raman spectroscopy apparatus 400 depicted in FIG. 16 is used to apply the laser beam 401 as light in the assessing step ST4-3, as with Embodiment 1.

In the assessing step ST4-3, the controller 420 of the Raman spectroscopy apparatus 400 controls the relative actuator to move the microscope 411 and the semiconductor substrate 1 relatively along the X-axis and the Y-axis, controls the light source 410 to apply the laser beam 401 to the reverse side 5 of the semiconductor substrate 1, calculates an amount of distortion at each of positions on the surface layer 2 of the semiconductor substrate 1, and stores the calculated amount of distortion together with the position on the surface layer 2. The method of assessing a semiconductor substrate is finished when the Raman spectroscopy apparatus 400 has measured an amount of distortion at each of positions on the surface layer 2 of the semiconductor substrate 1 as a target to be assessed by the method.

With the method of assessing a device chip according to Embodiment 3, since the semiconductor substrate 1 is thinned to a thickness smaller than the finished thickness 100 in the thinning step ST3-3, amounts of distortion in the surface layer 2 of the semiconductor substrate 1 can be measured and assessed using the laser beam 401 applied to the semiconductor substrate 1 from the reverse side 5 in the assessing step ST4-3. As a result, the method of assessing a device chip according to Embodiment 3 can measure amounts of distortion in the surface layer 2 at any arbitrary positions on the reverse side 5, making it possible to reduce the period of time required to measure distortions in the surface layer 2 of the semiconductor substrate 1.

With the method of assessing a device chip according to Embodiment 3, since amounts of distortion in the surface layer 2 at any arbitrary positions on the reverse side 5 can be measured, by measuring amounts of distortion of the reverse side 5 in its entirety, it is possible to obtain a two-dimensional distribution of amounts of distortion in the surface layer 2 of the semiconductor substrate 1.

Furthermore, since the method of assessing a device chip according to Embodiment 3 is able to obtain a two-dimensional distribution of amounts of distortion in the surface layer 2 of the semiconductor substrate 1, the method of assessing a device chip according to Embodiment 3 can grasp the electronic characteristics of the device layer 4. It is possible to control the distribution of amounts of distortion in the surface layer 2 of the semiconductor substrate 1, i.e., the electronic characteristics of the device layer 4, by changing the pattern of the device layer 4. As a result, the method of assessing a device chip according to Embodiment 3 can obtain a two-dimensional distribution of amounts of distortion in the surface layer 2 of the semiconductor substrate 1 which affect the electronic characteristics of the device chip 20 which may have become defective. Such a two-dimensional distribution of amounts of distortion in the surface layer 2 is useful in finding the cause of any defect of the device chip 20.

Moreover, with the method of assessing a device chip according to Embodiment 3, the semiconductor substrate 1 is thinned until its reduced thickness allows the distortions of the semiconductor substrate 1 to be observed from the reverse side 5 in the thinning step ST3-3. Consequently, amounts of distortion caused in the surface layer 2 of the semiconductor substrate 1 at the time the device layer 4 was formed thereon can accurately be measured and assessed. The method of assessing a device chip according to Embodiment 3 is characterized in that the semiconductor substrate 1 is thinned to the thickness 101 that allows distortions in the surface layer 2 to be measured. Therefore, distortions in the surface layer 2 can sufficiently be measured by thinning the semiconductor substrate 1 to the thickness 101 by taking the depth to which the laser beam 401 enters the semiconductor substrate 1 into account, without actually making the surface layer 2 exposed to the reverse side 5. As the method of assessing a device chip according to Embodiment 3 allows distortions in the surface layer 2 to be measured without exposing the surface layer 2 as a target to be measured, it is possible to thin the semiconductor substrate 1 more easily and to measure distortions in the surface layer 2 more easily than if the surface layer 2 as a target to be measured is fully exposed.

The method of assessing a device chip according to Embodiment 3 may use the X-ray diffraction apparatus 405 depicted in FIG. 17 in the assessing step ST4-3, as with Embodiment 2. In other words, the method of assessing a device chip according to Embodiment 3 may measure and assess amounts of distortion of the semiconductor substrate 1 by measuring diffracted X-rays 407 produced as a result of dispersion and interference of the X-rays 406 applied to the semiconductor substrate 1 from the reverse side 5.

Moreover, with the method of assessing a device chip according to Embodiment 3, the thinning step ST3-3 and the assessing step ST4-3 may be repeated until distortions in the surface layer 2 can be observed from the reverse side 5 in a step ST5-3 depicted in FIG. 18, as with the modification depicted in FIG. 12, so that the semiconductor substrate 1 may be thinned stepwise and amounts of distortion may be measured in each of the steps.

As the method of assessing a device chip as depicted in FIG. 18 allows distortions in the surface layer 2 to be measured without exposing the surface layer 2 as a target to be measured, as with the modification depicted in FIG. 12, amounts of distortion in the surface layer 2 can be grasped more easily than if the surface layer 2 as a target to be measured is fully exposed.

The present invention is not limited to the above embodiments and modifications, but many changes and modifications may be made therein without departing from the scope of the invention. The method of assessing a semiconductor substrate and the method of assessing a device chip according to the embodiments and modifications described above measure and assess distortions (amounts of distortion) which represent an example of properties. However, a target to be measured and assessed according to the present invention may be any properties, and is not limited to distortions (amounts of distortion).

According to the present invention, for example, crystal orientations (information regarding crystals) which represent an example of properties of the semiconductor substrate 1 may be measured and assessed by the same means as with the embodiments and modifications. The crystal orientations of the surface layer 2 of the semiconductor substrate 1 may vary when the device layer 4 is formed on the face side 3 of the semiconductor substrate 1. According to the present invention, if crystal orientations of the semiconductor substrate 1 are to be measured and assessed, the surface layer 2 refers to a portion of the semiconductor substrate 1 where its crystal orientations vary due to the formation of the device layer 4. Since the crystal orientations of the surface layer 2 are measured from the reverse side 5 of the semiconductor substrate 1 according to the present invention, the period of time required to measure the crystal orientations of the surface layer 2 of the semiconductor substrate 1 can be reduced, and a two-dimensional distribution of crystal orientations of the surface layer 2 of the semiconductor substrate 1 can be obtained, as with the above embodiments and modifications.

The present invention is not limited to the details of the above described preferred embodiments. The scope of the invention is defined by the appended claims and all changes and modifications as fall within the equivalence of the scope of the claims are therefore to be embraced by the invention.

The status of the claims is as follows:

1. A method of assessing a semiconductor substrate with a device layer disposed on a face side thereof to assess a property of a surface layer of the semiconductor substrate, comprising:

a sticking step of sticking the device layer of the semiconductor substrate to a support substrate;

a thinning step of thinning the semiconductor substrate from a reverse side thereof to a thickness that allows distortions of the surface layer of the semiconductor substrate to be observed after the sticking step is carried out; and an assessing step of applying light to the semiconductor substrate from the reverse side thereof and measuring scattered light from the semiconductor substrate thereby to assess the property of the semiconductor substrate.

2. The method of assessing a semiconductor substrate according to claim 1, wherein the semiconductor substrate is thinned stepwise by repeating the thinning step and the assessing step.

3. A method of assessing a semiconductor substrate with a device layer disposed on a face side thereof to assess a property of a surface layer of the semiconductor substrate, comprising:

a sticking step of sticking the device layer of the semiconductor substrate to a support substrate;

a thinning step of thinning the semiconductor substrate from a reverse side thereof to a thickness smaller than a finished thickness after the sticking step is carried out; and an assessing step of applying X-rays to the semiconductor substrate from the reverse side thereof and measuring diffracted X-rays produced as a result of dispersion and interference from the semiconductor substrate thereby to assess the property of the semiconductor substrate.

4. The method of assessing a semiconductor substrate according to claim 3, wherein the semiconductor substrate is thinned stepwise by repeating the thinning step and the assessing step.

5. The method of assessing a semiconductor substrate according to claim 3, wherein the semiconductor substrate is thinned until distortions of the surface layer of the semiconductor substrate is observed.

6. A method of assessing a device chip divided from a wafer to assess a property of a surface layer of a semiconductor substrate in the device chip, comprising:

a sticking step of sticking a device layer disposed on a face side of the semiconductor substrate in the device chip to a support substrate;

a thinning step of thinning the semiconductor substrate from a reverse side thereof to a thickness that allows distortions of the surface layer of the semiconductor substrate to be observed after the sticking step is carried out; and an assessing step of applying light to the semiconductor substrate from the reverse side thereof and measuring scattered light from the semiconductor substrate thereby to assess the property of the semiconductor substrate.

7. A method of assessing a device chip divided from a wafer to assess a property of a surface layer of a semiconductor substrate in the device chip, comprising:

a sticking step of sticking a device layer disposed on a face side of the semiconductor substrate in the device chip to a support substrate;

a thinning step of thinning the semiconductor substrate from a reverse side thereof to a thickness smaller than a finished thickness after the sticking step is carried out; and an assessing step of applying X-rays to the semiconductor substrate from the reverse side thereof and measuring diffracted X-rays produced as a result of dispersion and interference from the semiconductor substrate thereby to assess the property of the semiconductor substrate.

* * * * *